United States Patent [19]

Smith

[11] Patent Number: 4,984,276

[45] Date of Patent: Jan. 8, 1991

[54] DIGITAL SIGNAL PROCESSING USING WAVEGUIDE NETWORKS

[75] Inventor: Julius O. Smith, Menlo Park, Calif.

[73] Assignee: The Board of Trustees of the Leland Stanford Junior University, Stanford, Calif.

[21] Appl. No.: 414,646

[22] Filed: Sep. 27, 1989

Related U.S. Application Data

[63] Continuation of Ser. No. 275,620, Nov. 14, 1988, abandoned, which is a continuation of Ser. No. 920,701, Oct. 17, 1986, abandoned, which is a continuation-in-part of Ser. No. 859,868, May 2, 1986, abandoned.

[51] Int. Cl.[5] ............ H03G 3/00

[52] U.S. Cl. ............ 381/63; 84/630; 84/707

[58] Field of Search ............ 84/630, 707; 364/724.11, 724.15, 724.16; 381/63

[56] References Cited

U.S. PATENT DOCUMENTS

| | | | |
|---|---|---|---|
| 4,344,148 | 8/1982 | Brantingham et al. | 364/724 |
| 4,389,540 | 6/1983 | Nakamura et al. | 364/724 X |
| 4,548,119 | 10/1985 | Wachi et al. | 84/1.19 |
| 4,554,858 | 11/1985 | Wachi et al. | 84/1.19 |
| 4,633,500 | 12/1986 | Yamada et al. | 381/51 |

OTHER PUBLICATIONS

H. Kimura, "Generalized Schwarz Form and Lattice-Ladder Realizations of Digital Filters," *IEEE Transactions on Circuits and Systems*, vol. CAS-32, No. 11, Nov. 1985.

H. Kimura et al., "Canonical Pipelining of Lattice Filters," *IEEE Transactions on Acoustics, Speech, and Signal Processing*, vol. ASSP-35, No. 6, Jun. 1987.

Maurice Bellanger, *Digital Processing of Signals Theory and Practice*, John Wiley & Sons, copyright © 1984, Library of Congress Catalog Card No.: 83-17035, pp. 229-239 & 362-368.

*Primary Examiner*—Forester W. Isen

*Attorney, Agent, or Firm*—Spensley Horn Jubas & Lubitz

[57] ABSTRACT

Disclosed is a signal processor formed using digital waveguide networks. The digital waveguide networks have signal scattering junctions. A junction connects two waveguide sections together or terminates a waveguide. The junctions are constructed from conventional digital components such as multipliers, adders, and delay elements. The signal processor of the present invention is typically used for digital reverberation and for synthesis of reed, string or other instruments.

16 Claims, 8 Drawing Sheets

DIGITAL SIGNAL PROCESSING USING WAVEGUIDE NETWORKS

This application is a continuation of Ser. No. 275,620, filed Nov. 14, 1988, now abandoned, which is a continuation of Ser. No. 920,701, filed Oct. 17, 1986, now abandoned, which is in turn a continuation-in-part of Ser. No. 859,868, filed May 2, 1986, now abandoned.

BACKGROUND OF THE INVENTION

This invention relates to the field of digital signal processing and particularly to signal processing useful in digital music synthesis and other applications.

Digital music synthesis has attracted increased interest as data processors have undergone new developments which provide increased performance capabilities. Digital music synthesis has many applications such as the synthesis of stringed, reed and other instruments and such as the synthesis of reverberation.

In actual practice, it has been difficult to provide satisfactory models of music instruments, based upon quantitative physical models, which can be practically synthesized on a real-time basis using present-day computers and digital circuitry.

Most traditional musical instruments, such as woodwinds and strings, have been simulated by additive synthesis which consists of summing together sinusoidal harmonics of appropriate amplitude, or equivalently by repeatedly reading from a table consisting of one period of a tone (scaled by an "amplitude function") to "play a note." Another method consists of digitally sampling a real musical sound, storing the samples in digital memory, and thereafter playing back the samples under digital control. FM synthesis as described, for example, in U.S. Pat. No. 4,018,121, has also been successful in synthesizing many musical sounds including brasses, woodwinds, bells, gongs, and some strings. A few instruments have been simulated by "subtractive synthesis" which shapes the spectrum of primitive input signals using digital filters.

All of the foregoing methods (with the occasional exception of subtractive synthesis) have the disadvantage of not being closely related to the underlying physics of sound production. Physically accurate simulations are expensive to compute when general finite-element modeling techniques are used.

Digital reverberation has also been difficult to achieve. Although digital music synthesis has employed digital reverberation as a post-processing function for many years, there still remains a need to be able to simulate with digital signal processing the quality of reverberation which exists in natural listening-space environments. The basic acoustics of reverberation in natural listening-space environments, such as concert halls, has a long history with many different design theories. The goal of digital reverberation is to produce digital signal processing methods which simulate the effect that a good concert hall or other good "listening space" has on sound. This goal is made difficult because typical good listening spaces are inherently large-order, complex acoustical systems which cannot be precisely simulated in real-time using commonly available computing techniques.

In architectural acoustics, an understanding of digital reverberation is important in the design of concert halls with good acoustical qualities. In digitally synthesized music, reverberation is a part of the synthesized instrumental ensemble and provides enrichment to the sound quality. For these reasons, there have been many attempts to capture the musically important qualities of natural reverberation in digital music synthesis.

Digital room simulation (reverberation) has been implemented by simulating specular reflection in actual or approximate concert-hall geometries. The diffusive scattering of sound in such natural listening environments must be considered in order to obtain high-quality reverberation models. However, practical models which accommodate diffusing reflections have been beyond the reach of present computing power when applied to listening spaces of nominal size over the audio frequency band.

In another implementation of digital reverberation, an approximation to the impulse response between two spatial points in a real concert hall has been recorded. The effect of the hall on sound between these two points can be accurately simulated by convolving the measured impulse response with the desired source signal. Again, this implementation leads to a prohibitive computational burden which is two to three orders of magnitude beyond the real-time capability of typical present-day mainframe computers.

The current state of high-quality digital reverberation based upon large (concert hall) spaces, although well understood, is too expensive to synthesize by computation. Because there is much detail in natural reverberation that is not important perceptually, models for reverberation need to be simplified so as to become computationally practical.

One example of a computationally simple model relies upon convolving unreverberated sound with exponentially decaying white noise thereby producing the heretofore best known artificial reverberation. The digital reverberator designs based upon quantitative physical models need to be replaced by models based upon simple computations which retain the qualitative behavior of natural listening space reverberation.

Some basic building blocks of presently known digital reverberators include cascaded and nested allpass networks, recursive and non-recursive comb filters, tapped delay lines, and lowpass filters. The early reflections can be exactly matched for a fixed source and listener position using a tapped delay line, and the late reverberation can be qualitatively matched using a combination of allpass chains, comb filters, and lowpass filters. Using a lowpass filter in the feedback loop of a comb filter simulates air absorption and nonspecular reflection. These known techniques for reverberation have been the basis for reverberation design for more than a decade. Although these elements do provide some essential aspects of reverberation, especially for smoothly varying sounds at low reverberation levels, they do not provide reverberation on a par with excellent natural listening-space environments.

In accordance with the above background, there is a need for techniques for synthesizing strings, winds, and other musical instruments including reverberators in a manner which is both physically meaningful and computationally efficient. There is a need for the achievement of natural and expressive computer-controlled performance in ways which are readily comprehensible and easy to use.

SUMMARY OF THE INVENTION

The present invention is a signal processor formed using digital waveguide networks. The digital waveguide networks have signal scattering junctions. A junction connects two waveguide sections together or terminates a waveguide. The junctions are constructed from conventional digital components such as multipliers, adders, and delay elements. The number of multiplies and additions determines the number of signal-scattering junctions that can be implemented in the waveguide network, and the number of delays determines the total delay which can be distributed among the waveguides interconnecting the junctions in the waveguide network. The signal processor of the present invention is typically used for digital reverberation and for synthesis of reed, string or other instruments.

The waveguides of the present invention include a first rail for conducting signals from stage to stage in one direction and a second rail for conducting signals from stage to stage in the opposite direction. The accumulated delay along the first rail is substantially equal to the accumulated delay along the second rail so that the waveguide is balanced. The first rail is connected to the second rail at junctions so that signals conducted by one rail are also conducted in part by the other rail.

Lossless waveguides used in the present invention are bi-directional delay lines which sometimes include embedded allpass filters. Losses are introduced as pure attenuation or lowpass filtering in one or both directions.

The signal processor in some applications includes a non-linear junction connected to provide an input signal to the first rail of the waveguide and to receive an output signal from the second rail of the waveguide. The non-linear junction in some embodiments receives a control variable for controlling the non-linear junction and the signals to and from the waveguide.

In one embodiment, a digital reverberator is formed by a multi-branch network of lossless digital waveguides.

In another embodiment, a reed instrument is synthesized by a non-linear junction terminating a digital waveguide. A primary control variable, representing mouth pressure, is input to the non-linear junction (also controlled secondarily by embouchure variables). The junction simulates the reed while the digital waveguide simulates the bore of the reed instrument.

In another embodiment, a string instrument is synthesized. A primary control variable, representing the bow velocity, is input to the non-linear junction. The non-linear junction represents the bow-string interface (including secondary controls such as bow force, bow angle, bow position, and friction characteristics). In the stringed instrument embodiment, two digital lossless waveguides are connected to the non-linear junction. The first waveguide represents the long string portion (from the bow to the nut) and the other waveguide simulates the short string portion (from the bow to the bridge). A series of waveguides can also be used to implement the body of, for example, a violin, although in such a case there is normally no direct physical interpretation of the waveguide variables.

In particular embodiments, the reflection signal or signal coefficients introduced into the waveguides from the nonlinear junction are obtained from a table. In one embodiment, the nonlinearity to be introduced into the waveguides is f(x) where x is the table address and also the incoming signal sample in the waveguide (a travelling wave sample). In another embodiment, the values $g(x)=f(x)/x$ are stored in the table and the table is addressed by x. Each value of g(x) addressed by x from the compressed table (where g(x) is called a coefficient) is then multiplied by x, $x*g(x)$ which thereby produces the desired value of f(x).

In accordance with the above summary, the present invention captures the musically important qualities of natural instruments in digital music synthesis with digital processing techniques employing digital waveguides which are computationally efficient and therefore capable of inexpensive real-time operation.

The foregoing and other objects, features and advantages of the invention will be apparent from the following detailed description in conjunction with the drawings.

DETAILED DESCRIPTION

Figure 1:
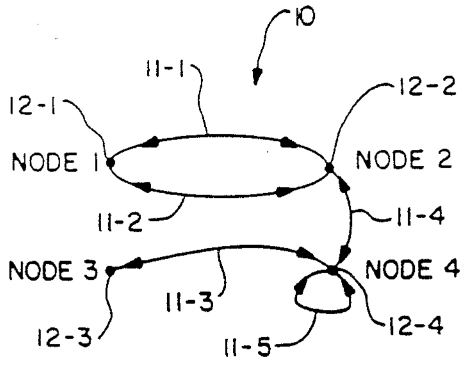
FIG. 1 depicts a simple closed waveguide network.

Lossless Networks—FIG. 1

In FIG. 1 a network 10 is a closed interconnection of bi-directional signal paths 11. The signal paths 11 are called branches or waveguides, designated 11-1, 11-2, 11-3, 11-4, and 11-5 and the interconnection points are called nodes or junctions, designated 12-1, 12-2, 12-3, and 12-4. An example of a simple network is shown in FIG. 1 where each signal path is bi-directional, meaning that in each waveguide there is a signal propagating in one direction and an independent signal propagating in the other direction. When a signal reaches a junction, one component is partially reflected back along the same waveguide, and other components are partially transmitted into the other waveguides connected to the junction. The relative strengths of the components of the transmitted or "scattered" signals at each junction are determined by the relative characteristic impedances of the waveguides at the junction. In FIG. 1, the waveguides 11 intersect at the junctions 12.

A lossless waveguide, such as each of the waveguides in FIG. 1, is defined specifically as a lossless bi-directional signal branch. In the simplest case, each branch or waveguide 11 in a waveguide network 10 is merely a bi-directional delay line. The only computations in the network take place at the branch intersection points (nodes or junctions). More generally, a lossless waveguide branch may contain a chain of cascaded allpass filters. For practical reverberator and other designs, losses are introduced in the form of factors less than 1 and/or low pass filters with a frequency response strictly bounded above by 1 in magnitude.

A closed lossless network preserves total stored signal energy. Energy is preserved if, at each time instant, the total energy stored in the network is the same as at any other time instant. The total energy at any time instant is found by summing the instantaneous power throughout the network waveguides 11. Each signal sample within the network contributes to instantaneous power. The instantaneous power of a stored sample is the squared amplitude times a scale factor, g. If the signal is in units of "pressure", "force", or equivalent, then $g=1/Z$, where Z is the characteristic impedance of the waveguide 11 medium. If the signal sample instead represents a "flow" variable, such as volume-velocity, then $g=Z$. In either case, the stored energy is a weighted sum of squared values of all samples stored in the digital network 10.

Figure 2:
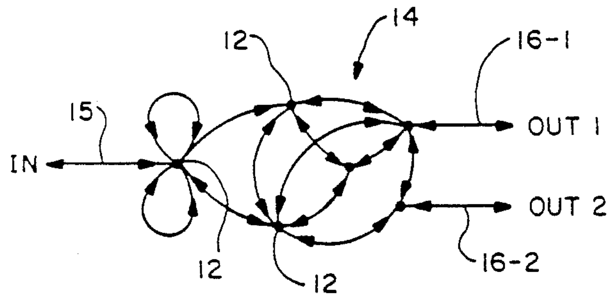
FIG. 2 depicts a 3-port waveguide network.

N-Port Network—FIG. 2

In FIG. 2, an N-port network 14 is shown in which for $N=3$, three waveguides, called ports, leave the network with one port 15 designated for input and two ports 16-1 and 16-2 designated for output. Such a structure is suitable, for example, for providing stereo reverberation of a single channel of sound. Note, however, that really in FIG. 2 there are three inputs (15, 16-1, 16-2) and three outputs (15, 16-1, 16-2) because in an N-port, each waveguide connected to the network provides both an input and an output since each waveguide is bi-directional.

An N-port network 14 of FIG. 2 is lossless if at any time instant, the energy lost through the outputs, equals the total energy supplied through the inputs, plus the total stored energy. A lossless digital filter is obtained from a lossless N-port by using every port as both an input and an output. This filter is the general multi-input, multi-output allpass filter.

An N-port network 14 is linear if superposition holds. Superposition holds when the output in response to the sum of two input signals equals the sum of the outputs in response to each individual input signal. A network is linear if every N-port derived from it is linear. Only linear networks can be restricted to a large and well-understood class of energy conserving systems.

Figure 3:
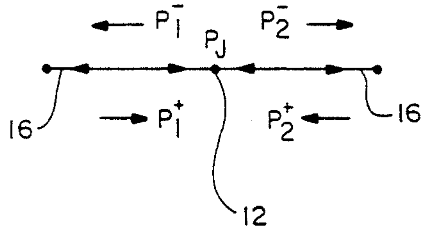
FIG. 3 depicts a junction of two waveguides.

Lossless Scattering—FIG. 3

Consider a parallel junction of N lossless waveguides of characteristic impedance $Z_i$ (characteristic admittance $\Gamma_i=1/Z_i$) as depicted in FIG. 3 for $N=2$.

If in FIG. 3 the incoming traveling pressure waves are denoted by $P_i^+$, where $i=1, \ldots, N$, the outgoing pressure waves are given by Eq. (1) as follows:

$$P_i^- = P_j - P_i^+ \qquad \text{Eq. (1)}$$

where $P_j$ in Eq. (1) is the resultant junction pressure given as follows:

$$P_j = \sum_{i=1}^{N} \alpha_1 P_i^+ \qquad \text{Eqs. (2)}$$

$$\text{where } \alpha_i = (2\Gamma_i) / \left( \sum_{l=1}^{N} \Gamma_l \right)$$

For $N=2$, $P_j=\alpha_1 P_1^+ + \alpha_2 P_2^+$ $\alpha_1=(2\Gamma_1)/(\Gamma_1+\Gamma_2)$ $\alpha_2=2-\alpha_1$ Define the reflection coefficient by $k=\alpha_1-1$, then from Eq. 1, $$\begin{aligned} P_1^- &= P_j - P_1^+ \\ &= (\alpha_1 - 1)P_1^+ + \alpha_2 P_2^- \end{aligned}$$

$$P_1^- = kP_1^+ + (1-k)P_2^+$$

$$P_2^- = \alpha_1 P_1^+ + (\alpha_2 - 1)P_2^+$$

$$P_2^- = (k+1)P_1^+ - kP_2^+$$

Thus, we have, for $N=2$, $$P_1^- = P_2^+ + k(P_1^+ - P_2^+)$$

$$P_2^- = P_1^+ + k(P_1^+ - P_2^+) \qquad \text{Eqs. (3)}$$

which is the one-multiplier lattice filter section (minus its unit delay). More generally, an N-way intersection requires N multiplies and $N-1$ additions to obtain $P_j$, and one addition for each outgoing wave, for a total of N multiplies and $2N-1$ additions.

The series flow-junction is equivalent to the parallel pressure-junction. The series pressure-junction or the parallel flow-junction can be found by use of duality.

Figure 4:
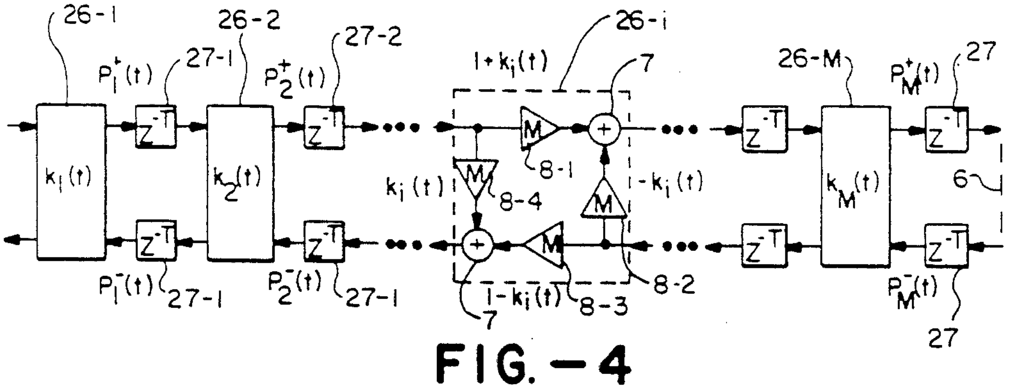
FIG. 4 depicts a cascade waveguide network in accordance with the present invention.

Cascade Waveguide Chains—FIG. 4

The basic waveguide chain 25 is shown in FIG. 4. Each junction 26-1, 26-2, . . . , 26-i, . . . , 26-M enclosing the symbol $k_i(t)$ denotes a scattering junction characterized by $k_i(t)$. In FIG. 4, the junction 26-i typically utilizes multipliers(M) 8 and adders(+) 7 to form the junction. In FIG. 4, the multipliers 8-1, 8-2, 8-3 and 8-4 multiply by the factors $[1+k(i)]$, $[-k_i(t)]$, $[1-k_i(t)]$, and $[k_i(t)]$, respectively. An alternative junction implementation 26'-i of FIG. 13 requires only one multiply. The junction 26-2 in FIG. 4 corresponds, for example, to the junction 12 in FIG. 3. Similarly, the delays 27-1 and 27-2 in FIG. 4 correspond to the branches 15 and 16, respectively, in FIG. 3. The Kelly-Lochbaum junctions 26-i and one-multiply junction 26'-i (see FIG. 13) or any other type of lossless junction may be used for junction 26. In particular, the two-multiply lattice (not shown) and normalized ladder (FIG. 11) scattering junctions can be employed. The waveguide 25 employs delays 27 between each scattering junction 26 along both the top and bottom signal paths, unlike conventional ladder and lattice filters. Note that the junction 26-i of FIG. 4 employs four multipliers and two adds while junction 26'-i of FIG. 13 employs one multiply and three adds.

Waveguide Variations—FIGS. 4–14

Reduction of junction 26 to other forms is merely a matter of pushing delays 27 along the top rail around to the bottom rail, so that each bottom-rail delay becomes 2T seconds ($Z^{-2T}$) instead of T seconds $Z^{-T}$. Such an operation is possible because of the termination at the right by an infinite (or zero) characteristic impedance 6 in FIG. 4. In the time-varying case, pushing a delay through a multiply results in a corresponding time advance of the multiplier coefficient.

Figure 5:
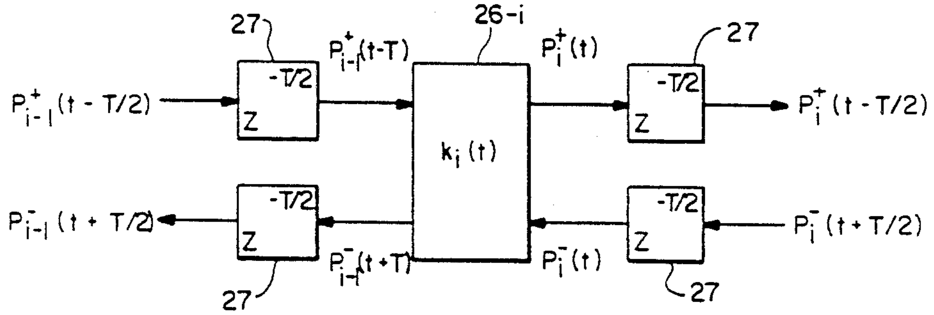
FIG. 5 depicts one embodiment of a cascade waveguide network section.

Imagine each delay element 27 in FIG. 4 being divided into halves, denoted by a delay of T/2 seconds. Then any waveguide can be built from sections such as shown in FIG. 5.

By a series of transformations, the two input-signal delays are pushed through the junction to the two output delays. A similar sequence of moves pushes the two output delays into the two input branches. Consequently, we can replace any waveguide section of the form shown in FIG. 5 by a section of the form shown in FIG. 6 or FIG. 7.

Figure 6:
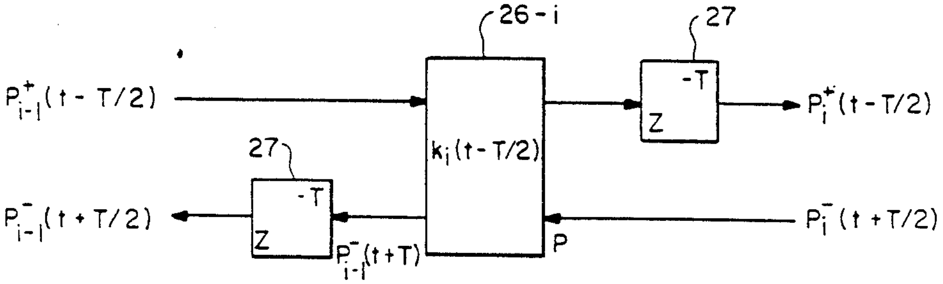
FIG. 6 depicts another embodiment of a cascade waveguide network section.
Figure 7:
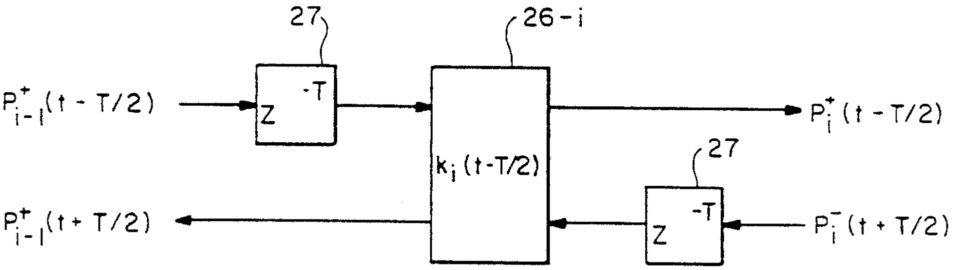
FIG. 7 depicts a third embodiment of a cascade waveguide network section.
Figure 8:
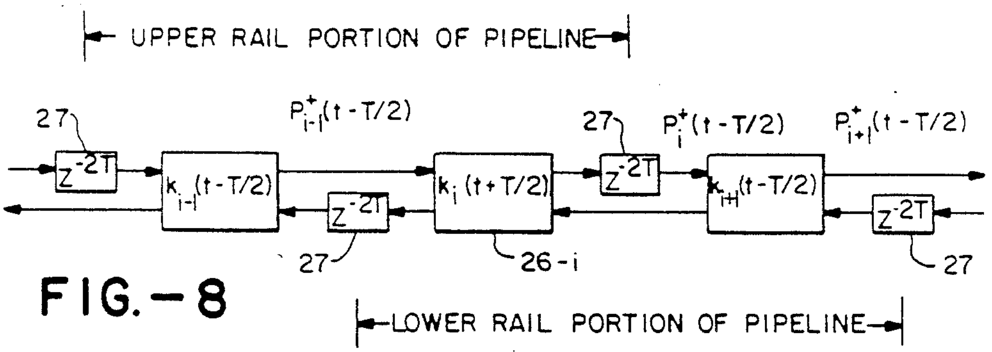
FIG. 8 depicts a pipelined embodiment of a waveguide filter.

By alternately choosing the structure of FIGS. 6 and 7, the structure of FIG. 8 is obtained. This structure has some advantages worth considering: (1) it consolidates delays to length 2T as do conventional lattice/ladder structures, (2) it does not require a termination by an infinite characteristic impedance, allowing it to be extended to networks of arbitrary topology (e.g., multiport branching, intersection, and looping), and (3) there is no long delay-free signal path along the upper rail as in conventional structures—a pipeline segment is only two sections long. This structure, termed the "half-rate waveguide filter", appears to have better overall characteristics than any other digital filter structure for many applications. Advantage (2) makes it especially valuable for modeling physical systems.

Finally, successive substitutions of the section of FIG. 6 and reapplication of the delay consolidation transformation lead to the conventional ladder or lattice filter structure. The termination at the right by a total reflection (shown as 6 in FIG. 4) is required to obtain this structure. Consequently, conventional lattice filters cannot be extended on the right in a physically meaningful way. Also, creating network topologies more complex than a simple series (or acyclic tree) of waveguide sections is not immediately possible because of the delay-free path along the top rail. For example, the output of a conventional structure cannot be fed back to the input.

Energy and Power

The instantaneous power in a waveguide containing instantaneous pressure P and flow U is defined as the product of pressure and flow as follows:

$$\mathcal{P} = PU = (P^+ + P^-)(U^+ + U^-) = \mathcal{P}^+ + \mathcal{P}^- \quad \text{Eq. (4)}$$

where, $$\mathcal{P}^+ = P^+U^+ = Z(U^+)^2 = \Gamma(P^+)^2$$

$$\mathcal{P}^- = P^-U^- = -Z(U^-)^2 = \Gamma(P^-)^2 \quad \text{Eqs. (5)}$$

define the right-going and left-going power, respectively.

For the N-way waveguide junction, we have, using Kirchoff's node equations, Eq. (6) as follows:

$$\mathcal{P}_j \stackrel{\Delta}{=} \sum_{i=1}^{N} P_i U_i = \sum_{i=1}^{N} P_j U_i = P_j \sum_{i=1}^{N} U_i = 0 \quad \text{Eq. (6)}$$

Thus, the N-way junction is lossless; no net power, active or reactive, flows into or away from the junction.

Quantization Effects

While the ideal waveguide junction is lossless, finite digital wordlength effects can make exactly lossless networks unrealizable. In fixed-point arithmetic, the product of two numbers requires more bits (in general) for exact representation than either of the multiplicands. If there is a feedback loop around a product, the number of bits needed to represent exactly a circulating signal grows without bound. Therefore, some round-off rule must be included in a finite-precision implementation. The guaranteed absence of limit cycles and overflow oscillations is tantamount to ensuring that all finite-wordlength effects result in power absorption at each junction, and never power creation. If magnitude truncation is used on all outgoing waves, then limit cycles and overflow oscillations are suppressed. Magnitude truncation results in greater losses than necessary to suppress quantization effects. More refined schemes are possible. In particular, by saving and accumulating the low-order half of each multiply at a junction, energy can be exactly preserved in spite of finite precision computations.

Signal Power in Time-Varying Waveguides

The convention is adopted that the time variation of the characteristic impedance does not alter the traveling pressure waves $P_i^{\pm}$. In this case, the power represented by a traveling pressure wave is modulated by the changing characteristic impedance as it propagates. The actual power becomes inversely proportional to characteristic impedance:

$$\mathcal{P}_i(x,t) = \mathcal{P}_i^+(x,t) + \mathcal{P}_i^-(x,t) = \frac{[P_i^+(x,t)]^2 - [P_i^-(x,t)]^2}{Z_i(t)} \quad \text{Eq. (7)}$$

This power modulation causes no difficulties in the Lyapunov theory which proves absence of limit cycles and overflow oscillations because it occurs identically in both the finite-precision and infinite-precision filters. However, in some applications it may be desirable to compensate for the power modulation so that changes in the characteristic impedances of the waveguides do not affect the power of the signals propagating within.

Figure 9:
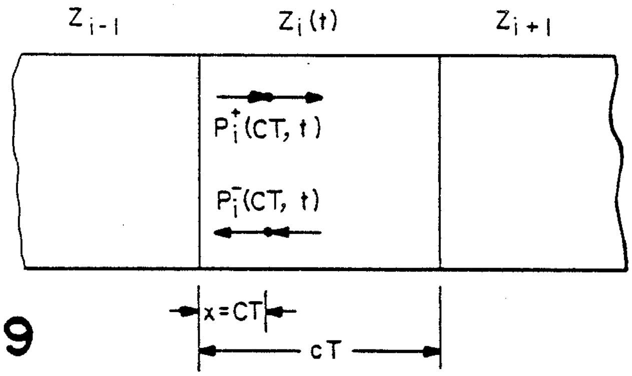
FIG. 9 depicts a travelling pressure wave at a general point within a waveguide section.

Consider an arbitrary point in the $i^{th}$ waveguide at time t and distance $x = c\tau$ measured from the left boundary, as shown in FIG. 9. The right-going pressure is $P_i^+(x,t)$ and the left-going pressure is $P_i^-(x,t)$. In the absence of scaling, the waveguide section behaves (according to our definition of the propagation medium properties) as a pressure delay line, and we have $P_i^+(x,t)=P_i^+(0,t-\tau)$ and $P_i^-(x,t)=P_i^-(0,t+\tau)=P_i^-(cT,t-T+\tau)$. The left-going and right-going components of the signal power are $[P_i^-(x,t)]^2/Z_i(t)$ and $[P_i^+(x,t)]^2/Z_i(t)$, respectively.

Below, three methods are discussed for making signal power invariant with respect to time-varying branch impedances.

Normalized Waveguides

Suppose the traveling waves are scaled as the characteristic impedance changes in order to hold signal power fixed. Any level can be chosen as a reference, but perhaps it is most natural to fix the power of each wave to that which it had upon entry to the section. In this case, it is quickly verified that the proper scaling is:

$$\tilde{P}_i^+(x,t)=[(Z_i(t))/(Z_i(t-\tau))]^{\frac{1}{2}}P_i^+(0,t-\tau),\ x=c\tau$$

$$\tilde{P}_i^-(x,t)=[(Z_i(t))/(Z_i(t-T+\tau))]^{\frac{1}{2}}P_i^-(cT,t-T+\tau) \qquad \text{Eqs. (8)}$$

In practice, there is no need to perform the scaling until the signal actually reaches a junction. Thus, we implement $$\tilde{P}_i^+(cT,t)=g_i(t)P_i^-(0,t-T)$$

$$\tilde{P}_i^-(0,t)=g_i(t)P_i^-(cT,t-T) \qquad \text{Eqs. (9)}$$

where $$g_i(t)=[(Z_i(t))/(Z_i(t-T))]^{\frac{1}{2}}$$

Figure 10:
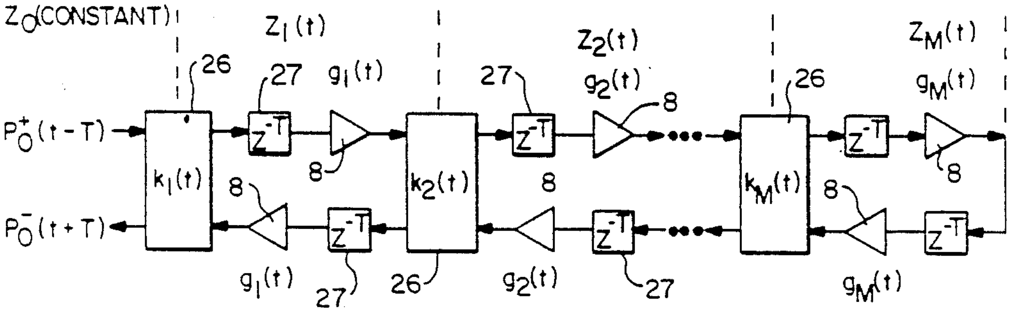
FIG. 10 depicts a normalized-waveguide digital filter.

This normalization is depicted in FIG. 10. In FIG. 10, each of the multipliers 8 multiplies the signal by $g_i(t)$ as given by Eqs. (9). In the single-argument notation used earlier, Eqs. (9) become $$\tilde{P}_i^+(t-T)=g_i(t)P_i^+(t-T)$$

$$\tilde{P}_i^-(t)=g_i(t)P_i^-(t) \qquad \text{Eqs. (10)}$$

This normalization strategy has the property that the time-varying waveguides (as well as the junctions) conserve signal power. If the scattering junctions are implemented with one-multiply structures, then the number of multiplies per section rises to three when power is normalized. There are three additions as in the unnormalized case. In some situations (such as in the two-stage structure) it may be acceptable to normalize at fewer points; the normalizing multiplies can be pushed through the scattering junctions and combined with other normalizing multiplies, much in the same way delays were pushed through the junctions to obtain standard ladder/lattice forms. In physical modeling applications, normalizations can be limited to opposite ends of a long cascade of sections with no interior output "taps."

To ensure passivity of a normalized-waveguide with finite-precision calculations, it suffices to perform magnitude truncation after multiplication by $g_i(t)$. Alternatively, extended precision can be used within the scattering junction.

Normalized Waves

Another approach to normalization is to propagate rms-normalized waves in the waveguide. In this case, each delay-line contains $$\tilde{P}_i^+(x,t)=P_i^+(x,t)/[Z_i(t)]^{\frac{1}{2}}$$

$$\tilde{P}_i^-(x,t)=P_i^-(x,t)/[Z_i(t)]^{\frac{1}{2}} \qquad \text{Eqs. (11)}$$

We now consider $P^\pm$ (instead of $P^\pm$) to be invariant with respect to the characteristic impedance. In this case, $$\tilde{P}_i^+(c,t)=P_i^+(cT,t)/[Z_i(t)]^{\frac{1}{2}}=P_i^+(0,t-T)/[Z_i(t-T)]^{\frac{1}{2}}=\tilde{P}_i^+(t-T)$$

The scattering equations become $$[Z_i(t)]^{\frac{1}{2}}P_i^+(0,t)=[1+k_i(t)][Z_{i-1}(t)]^{\frac{1}{2}}P_{i-1}^+(cT,t)-k_i(t)[Z_i(t)]^{\frac{1}{2}}\tilde{P}_i(0,t)$$

$$[Z_{i-1}(t)]^{\frac{1}{2}}\tilde{P}_{i-1}^-(cT,t)=k_i(t)[Z_{i-1}(t)]^{\frac{1}{2}}\tilde{P}_{i-1}^+(ct,T)+[1-k_i(t)][Z_i(t)]^{\frac{1}{2}}\tilde{P}_i^-(t) \qquad \text{Eqs. (12)}$$

or, solving for $\tilde{P}_i^\pm$, $$\tilde{P}_i^+(0,t)=[1+k_i(t)][(Z_{i-1}(t))/(Z_i(t))]^{\frac{1}{2}}\tilde{P}_{i-1}^+(cT,t)-k_i(t)\tilde{P}_i^-(0,t)$$

$$\tilde{P}_{i-1}^-(cT,t)=k_i(t)\tilde{P}_{i-1}^+(ct,T)+[1-k_i(t)][(Z_i(t))/(Z_{i-1}(t))]^{\frac{1}{2}}\tilde{P}_i^{31}(t) \qquad \text{Eqs. (13)}$$

But, $$(Z_{i-1}(t))/(Z_i(t))=(1-k_i(t))/(1+k_i(t)) \qquad \text{Eqs. (14)}$$

whence $$[1+k_i(t)][(Z_{i-1}(t))/(Z_i(t))]^{\frac{1}{2}}=[1-k_i(t)][(Z_i(t))/(Z_{i-1}(t))]^{\frac{1}{2}}=[1-k_i(t)]^{\frac{1}{2}} \qquad \text{Eq. (15)}$$

Figure 11:
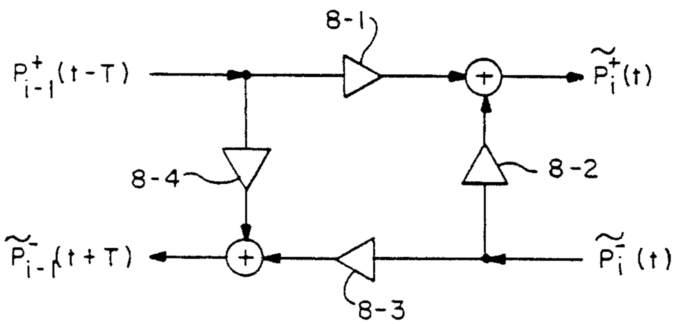
FIG. 11 depicts a wave-normalized waveguide junction.

The final scattering equations for normalized waves are $$\tilde{P}_i^+(0,t)=c_i(t)\tilde{P}_{i-1}^+(cT,t)-s_i(t)\tilde{P}_i^-(0,t)$$

$$\tilde{P}_{i-1}^-(cT,t)=s_i(t)\tilde{P}_{i-1}^+(ct,T)+c_i(t)\tilde{P}_i^-(t) \qquad \text{Eqs. (16)}$$

where $$s_i(t)\triangleq k_i(t)$$

$$c_i(t)\triangleq[1-k_i^2(t)]^{\frac{1}{2}} \qquad \text{Eqs. (17)}$$

can be viewed as the sine and cosine, respectively, of a single angle $\theta_i(t)=\sin^{-1}[k_i(t)]$ which characterizes the junction. FIG. 11 illustrates the Kelly-Lochbaum junction as it applies to normalized waves. In FIG. 11, the multipliers 8-1, 8-2, 8-3, and 8-4 multiply by the factors $[1-k_i(t)]^{\frac{1}{2}}$, $-k_i(t)$, $[1-k_i(t)]^{\frac{1}{2}}$, and $k_i(t)$, respectively. In FIG. 11, $k_i(t)$ cannot be factored out to obtain a one-multiply structure. The four-multiply structure of FIG. 11 is used in the normalized ladder filter (NLF).

Note that normalizing the outputs of the delay lines saves one multiply relative to the NLF which propagates normalized waves. However, there are other differences to consider. In the case of normalized waves, duals are easier, that is, changing the propagation variable from pressure to velocity or vice versa in the $i^{th}$ section requires no signal normalization, and the forward and reverse reflection coefficients are unchanged. Only sign-reversal is required for the reverse path. Also, in the case of normalized waves, the rms signal level is the same whether or not pressure or velocity is used. While appealing from a "balance of power" standpoint, normalizing all signals by their rms level can be a disadvantage. In the case of normalized delay-line outputs, dynamic range can be minimized by choosing the smaller of pressure and velocity as the variable of propagation.

Transformer-Coupled Waveguides

Still another approach to the normalization of time-varying waveguide filters is perhaps the most convenient of all. So far, the least expensive normalization technique is the normalized-waveguide structure, requiring only three multiplies per section rather than four in the normalized-wave case. Unfortunately, in the normalized-waveguide case, changing the characteristic impedance of section i results in a changing of the reflection coefficients in both adjacent scattering junctions. Of course, a single junction can be modulated in isolation by changing all downstream characteristic impedances by the same ratio. But this does not help if the filtering network is not a cascade chain or acyclic tree of waveguide sections. A more convenient local variation in characteristic impedance can be obtained using transformer coupling. A transformer joins two waveguide sections of differing characteristic impedance in such a way that signal power is preserved and no scattering occurs. It turns out that filter structures built using the transformer-coupled waveguide are equivalent to those using the normalized-wave junction described in the previous subsection, but one of the four multiplies can be traded for an addition.

From Ohm's Law and the power equation, an impedance discontinuity can be bridged with no power change and no scattering using the following relations:

$$[P_i^+]^2/[Z_i(t)]=[P_{i-1}^+]^2/[Z_{i-1}(t)]$$

$$[P_i^-]^2/[Z_i(t)]=[P_{i-1}^-]^2/[Z_{i-1}(t)] \qquad \text{Eqs. (18)}$$

Therefore, the junction equations for a transformer can be chosen as $$P_i^+=g_i(t)P_{i-1}^+$$

$$P_{i-1}^-=g_i^{-1}(t)P_i^- \qquad \text{Eqs. (19)}$$

where, from Eq. (14)

$$g_i(t)\triangleq[(Z_i(t))/(Z_{i-1}(t))]^{\frac{1}{2}}=[(1+k_i(t))/(1-k_i(t)]^{\frac{1}{2}} \qquad \text{Eq. (20)}$$

The choice of a negative square root corresponds to a gyrator. The gyrator is equivalent to a transformer in cascade with a dualizer. A dualizer is a direct implementation of Ohm's law (to within a scale factor) where the forward path is unchanged while the reverse path is negated. On one side of the dualizer there are pressure waves, and on the other side there are velocity waves. Ohm's law is a gyrator in cascade with a transformer whose scale factor equals the characteristic admittance.

Figure 12:
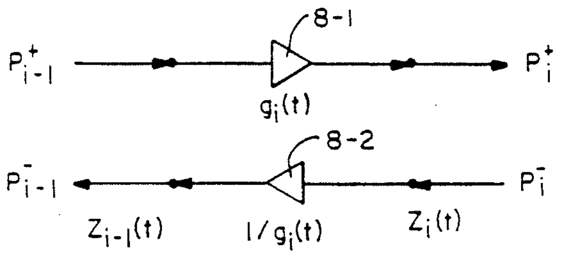
FIG. 12 depicts a transformer junction.

The transformer-coupled junction is shown in FIG. 12. In FIG. 12, the multipliers 8-1 and 8-2 multiply by $g_i(t)$ and $1/g_i(t)$ where $g_i(t)$ equals $[Z_i(t)/Z_{i-1}(t)]^{\frac{1}{2}}$. A single junction can be modulated, even in arbitrary network topologies, by inserting a transformer immediately to the left (or right) of the junction. Conceptually, the characteristic impedance is not changed over the delay-line portion of the waveguide section; instead it is changed to the new time-varying value just before (or after) it meets the junction. When velocity is the wave variable, the coefficients $g_i(t)$ and $g_i^{-1}(t)$ in FIG. 12 are swapped (or inverted).

So, as in the normalized waveguide case, the two extra multipliers 8-1 and 8-2 of FIG. 12 provide two extra multiplies per section relating to the unnormalized (one-multiply) case, thereby achieving time-varying digital filters which do not modulate stored signal energy. Moreover, transformers enable the scattering junctions to be varied independently, without having to propagate time-varying impedance ratios throughout the waveguide network.

Figure 13:
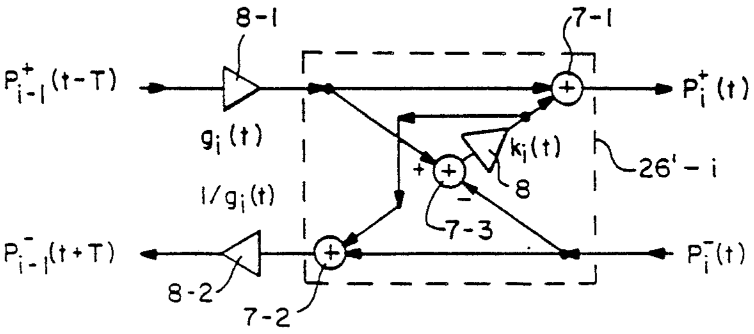
FIG. 13 depicts transformer-coupled waveguide junction.

In FIG. 13, the one-multiply junction 26'-i includes three adders 7-1, 7-2, and 7-3, where adder 7-3 functions to subtract the second rail signal, $P_i^-(t)$, from the first rail signal, $[P_{i-1}^+(t-T)][g_i(t)]$. Junction 26'-i also includes the multiplier 8 which multiplies the output from adder 7-3 by $k_i(t)$. FIG. 13 utilizes the junction of FIG. 12 in the form of multipliers 8-1 and 8-2 which multiply the first and second rail signals by $g_i(t)$ and $1/g_i(t)$, respectively, where $g_i(t)$ equals $[(1-k_i(t))/(1+k_i(t))]^{\frac{1}{2}}$.

It is interesting to note that the transformer-coupled waveguide of FIG. 13 and the wave-normalized waveguide (shown in FIG. 11) are equivalent. One simple proof is to start with a transformer and a Kelly-Lochbaum junction, move the transformer scale factors inside the junction, combine terms, and arrive at FIG. 11. The practical importance of this equivalence is that the normalized ladder filter (NLF) can be implemented with only three multiplies and three additions instead of four multiplies and two additions.

The limit cycles and overflow oscillations are easily eliminated in a waveguide structure, which precisely simulates a sampled interconnection of ideal transmissions line sections. Furthermore, the waveguide can be transformed into all well-known ladder and lattice filter structures simply by pushing delays around to the bottom rail in the special case of a cascade, reflectively terminated waveguide network. Therefore, aside from specific round-off error and time skew in the signal and filter coefficients, the samples computed in the waveguide and the samples computed in other ladder/lattice filters are identical (between junctions).

The waveguide structure gives a precise implementation of physical wave phenomena in time-varying media. This property is valuable in its own right for simulation purposes. The present invention permits the delay or advance of time-varying coefficient streams in order to obtain physically correct time-varying waveguide (or acoustic tube) simulations using standard lattice/ladder structures. Also, the necessary time corrections for the traveling waves, needed to output a simulated pressure or velocity, are achieved.

Figure 14:
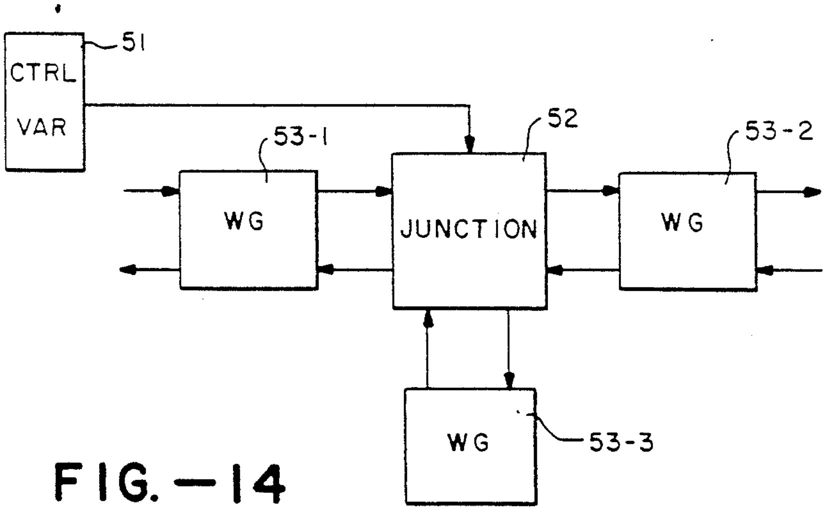
FIG. 14 depicts a non-linear junction, controlled by a control variable, and connected through a plurality of ports to a plurality of waveguides.

Waveguide Networks with Non-Linear Junction—FIG. 14

In FIG. 14, a plurality of waveguides 53 are interconnected by a non-linear junction 52. In the particular embodiment of FIG. 14, the junction 52 has three ports, one for each of the waveguide networks 53-1, 53-2, and 53-3. However, junction 52 can be an N-port junction interconnecting N waveguides or waveguide networks 53. The control variable register 51 provides one or more control variables as inputs to the junction 52. In FIG. 14 when only a single waveguide is utilized, the single waveguide becomes a special case, single-port embodiment of FIG. 14. Single port examples of the FIG. 14 structure are described hereinafter in connection with reed instruments such as clarinets or saxophones. Multi-port embodiments of the FIG. 14 structure are described hereinafter in connection with stringed instruments such as violins. A multi-port variation of the FIG. 14 structure is also described hereinafter in connection with a reverberator. Many other instruments not described in detail can also be simulated in accordance with the present invention. For example, flutes, organs, recorders, basoons, oboes, all brasses, and percussion instruments can be simulated by single or multi-port, linear or non-linear junctions in combination with one or more waveguides or waveguide networks.

Figure 15:
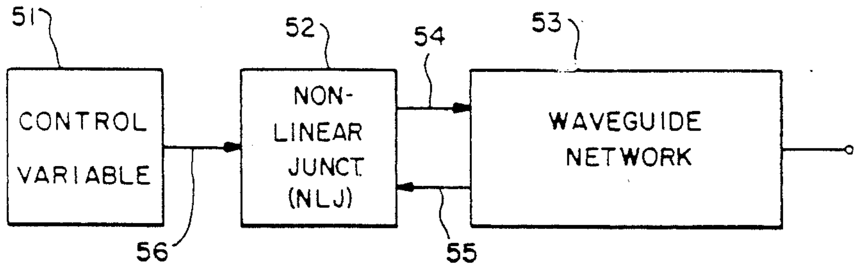
FIG. 15 depicts a terminating non-linear junction controlled by a control variable and connected to a waveguide network.

Waveguide with Non-Linear Terminating Junction—FIG. 15

In FIG. 15, a block diagram representation of a waveguide 53 driven by a non-linear junction 52 is shown. The non-linear junction 52 provides the input on the first rail 54 to the waveguide 53 and receives the waveguide output from the second rail on lines 55. A control variable unit 51 provides a control variable to the non-linear junction 52. The FIG. 15 structure can be used as a musical instrument for simulating a reed instrument in which case the control variable unit 51 simulates mouth pressure, that is the pressure drop across a reed. The non-linear junction 52 simulates the reed and the waveguide 53 simulates the bore of the reed instrument.

Figure 16:
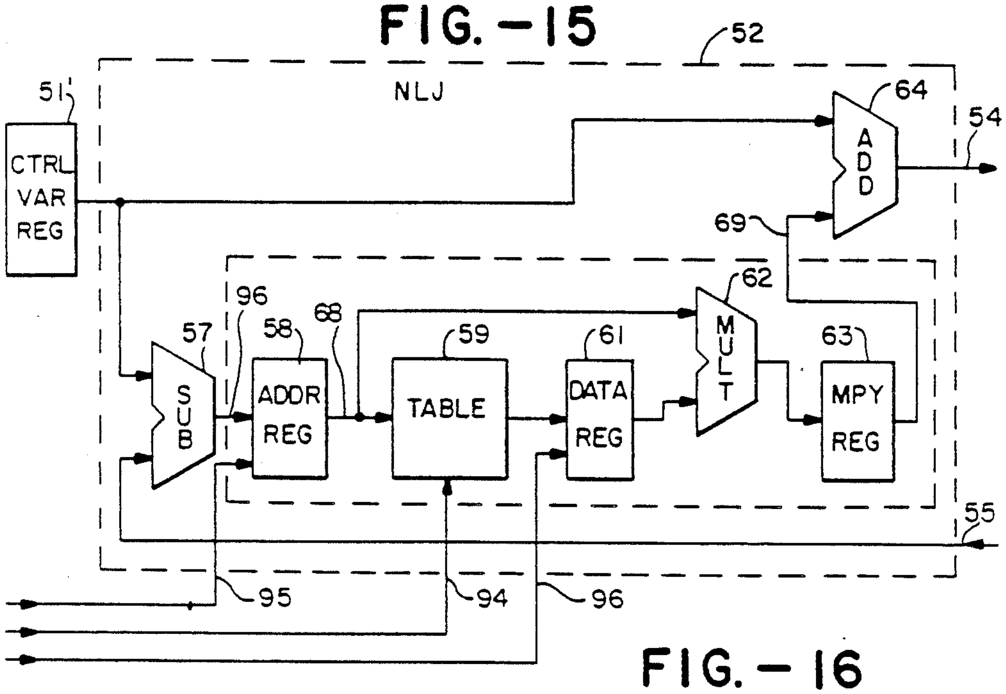
FIG. 16 depicts further details of the non-linear junction of FIG. 9.

Non-Linear Junction—FIG. 16

FIG. 16 depicts further details of a non-linear junction useful in connection with the FIG. 15 instrument for simulating a reed. The control register input on lines 56 is a control variable, such as mouth pressure. The control variable forms one input (negative) to a subtractor 57 which receives another input (negative) directly from the most significant bits of the waveguide second rail on lines 55. The subtractor 56 subtracts the waveguide output on lines 55 and the control variable on lines 56 to provide a 9-bit address on lines 69 to the coefficient store 70 and specifically the address register 58. The address in register 58 provides the address on lines 68 to a table 59 and to a multiplier 62. The table 59 is addressed by the address, x, from address register 58 to provide the data, g(x), in a data register 61. The contents, g(x), in the data register 61 are multiplied by the address, x, from address register 58 in multiplier 62 to provide an output, x*g(x), in the multiplier register 63 which is equal to f(x). The output from the multiplier register 63 is added in adder 64 to the control variable to provide the first rail input on lines 54 to the waveguide 53 of FIG. 15.

In FIG. 16, table 59 in one embodiment stores 512 bytes of data and provides an 8-bit output to the data register 61. The multiplier 62 provides a 16-bit output to the register 63. The high order 8 bits in register 63 are added in saturating adder 64 to the 8 bits from the variable register 51' to provide a 16-bit output on lines 54. Similarly, the high order 8-bits from the 16-bit lines 55 are subtracted in subtractor 57.

The contents of the table 59 in FIG. 16 represent compressed data. If the coefficients required are f(x) from the compressed table 70, only a fewer number of values, g(x), are stored in the table 59. The values stored in table 59 are f(x)/x which are equal to g(x). If x is a 16-bit binary number, and each value of x represents one 8-bit byte of data for f(x), table 59 is materially reduced in size to 512 bytes when addressed by the high-order 9 bits of x. The output is then expanded to a full 16 bits by multiplication in the multiplier 62.

Further compression is possible by interpolating values in the table 59. Many table interpolation techniques are well known. For example, linear interpolation could be used. Interpolation can also be used to compress a table of f(x) values directly, thus saving a multiply while increasing the needed table size, for a given level of relative error.

Other examples include a double look-up, address normalization, root-power factorization, address and value quantization, address mapping to histogram. Other compression techniques can be employed.

The manner in which the data values for a reed instrument are generated is set forth in APPENDIX A.

Figure 17:
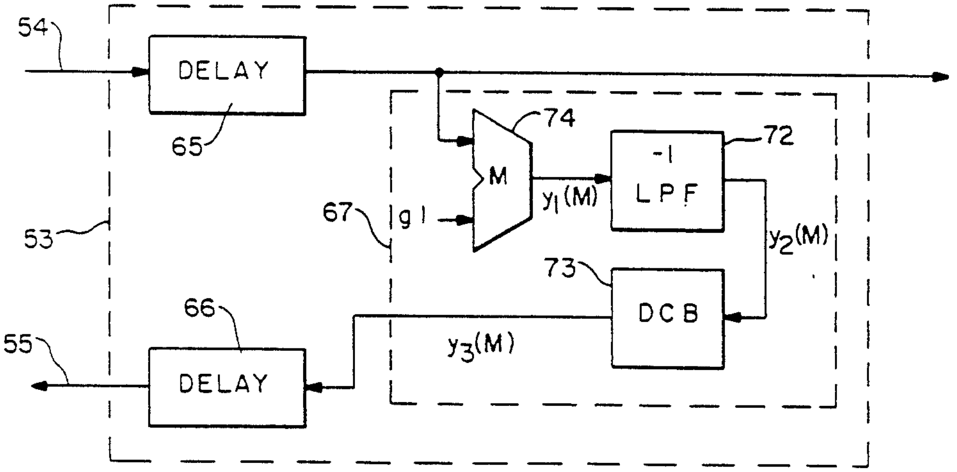
FIG. 17 depicts a block diagram representation of the waveguide of FIG. 9.

In FIG. 17, further details of a schematic representation of the waveguide 53 are shown. The waveguide 53 includes a first rail receiving the input on lines 54 and comprising a delay 65. A terminator 67 connects the delay 65 to the second rail delay 66 which in turn provides the second rail output on lines 55.

In an embodiment where the FIG. 16 signal processor of FIGS. 16 and 17 simulates a reed instrument, the terminator 67 is typically a single pole low-pass filter. Various details of a clarinet reed instrument in accordance with the signal processor of FIGS. 16 and 17 appear in APPENDIX B.

To simulate clarinet tone holes, a three-port scattering junction is introduced into the waveguide. Typically, the first three or four adjacent open tone holes participate in the termination of the bore.

In FIG. 17, the terminator 67 includes a multiplier 74, an inverting low-pass filter 72 and a DC blocking circuit 73. The multiplier 74 multiplies the signal on line 75 from the delay 65 by a loss factor $g_1$ where $g_1$ is typically $1-2^{-4}=0.9375$ for a clarinet. The output from the multiplier 74 is designated $y_1(n)$ where n is the sampled time index. The output from the low-pass filter 72 is designated $y_2(n)$, and the output from the DC blocking unit 73 is designated $y_3(n)$.

For a clarinet, the low-pass filter 72 has a transfer function $H_{12}(Z)$ as follows:

$$H_{12}(Z) = -(1-g)/(1-g\,Z^{1})$$

Therefore the signal $y_2(n)$ output from the low-pass filter 72 is given as follows:

$$y_2(n) = (g-1)y_1(n) + g y_2(n-1)$$

In the above equations, g is a coefficient which is typically determined as equal to $1-2^{-k}$ where k can be any selected value. For example, if k is 3, g is equal to 0.875 and g equal to 0.9 is a typical value. As another example, $1-2^{-3}+2^{-5}=0.90625$.

In FIG. 17, the transfer function, $H_{23}(Z)$, of the DC blocking circuit 73 is given as follows:

$$H_{23}(Z) = (1-Z^{-1})/(1-rZ^{-1})$$

With such a transfer function, the output signal $y_3(n)$ is given as follows:

$$y_3(n) = y_2(n) - y_2(n-1) + r y_3(n-1)$$

In simulations, the value of r has been set to zero. In actual instruments, DC drift can cause unwanted numerical overflow which can be blocked by using the DC block unit 73. Furthermore, when using the compressed table 70 of FIG. 16, the error terms which are produced are relative and therefore are desirably DC centered. If a DC drift occurs, the drift has the effect of emphasizing unwanted error components. Relative signal error means that the ratio of the signal error to signal amplitude tends to remain constant. Therefore, small signal values tend to have small errors which do not significantly disturb the intended operation.

In FIG. 17, for a clarinet, the delays 65 and 66 are typically selected in the following manner. One half the desired pitch period less the delay of the low-pass filter 72, less the delay of the DC block in unit 73, less the delay encountered in the non-linear junction 52 of FIG. 16.

When a saxophone is the reed instrument to be simulated by the FIG. 16 and FIG. 17 devices, a number of changes are made. The non-linear junction of FIG. 16 remains the same as for a clarinet. However, the waveguide network 53 of FIG. 15 becomes a series of cascaded waveguide sections, for example, of the FIG. 4 type. Each waveguide section represents a portion of the bore of the saxophone. Since the bore of a saxophone has a linearly increasing diameter, each waveguide section simulates a cylindrical section of the saxophone bore, with the waveguide sections representing linearly increasing diameters.

For a saxophone and other instruments, it is useful to have a non-linear bore simulation. Non-linearity results in excess absorption and pressure-dependent phase velocity. In order to achieve such non-linear simulation in accordance with the present invention, one method is to modify the delays in the waveguide structure of FIG. 8. In FIG. 8, each of the delays, $Z^{-2T}$, includes two units of delay. In order to introduce a non-linearity, one of the two units of delay is replaced by an all-pass filter so that the delay D changes from $Z^{-2T}$ to the following:

$$D=[Z^{-T}][(h+Z^{-T})/(1+hZ^{-T})]$$

With such a delay, the output signal, $y_2(n)$ is given in terms of the input signal, $y_1(n)$ as follows:

$$y_2(n)=h^*y_1(n-1)+y_1(n-2)-h^*y_2(n-1)$$

In the above equations, in order to introduce the non-linearity, the term h is calculated as a function of the instantaneous pressure in the waveguide, which is the sum of the travelling-wave components in the first rail and the second rail. For example, the first rail signal input to the delay, $y_1^+(n)$ is added to second rail signal $y_1^-(n)$ and then utilized by table look up or otherwise to generate some function for representing h as follows:

$$h=f[y_1^+(n)+y_1^-(n)]$$

The delay of the first-order all-pass as a function of h can be approximated by $(1-h)/(1+h)$ at low frequencies relative to the sampling rate. Typically, h is between $1-\epsilon$ and 0 for some small positive $\epsilon$ (the stability margin).

Using the principles described, simulation of a non-linear waveguide medium (such as air in a clarinet bore) is achieved. For clarinet and other instruments, the bore which is modeled by the waveguides of the present invention, includes tone holes that are blocked and unblocked to change the pitch of the tone being played. In order to create the equivalent of such tone holes in the instruments using waveguides in accordance with the present invention, a three-port junction can be inserted between cascaded waveguide sections. One port connects to one waveguide section, another port connects to another waveguide section, and the third port is unconnected and hence acts as a hole. The signal into the third port is represented as $P_3^+$ and this signal is equal to zero. The radiated signal from the third port, that is the radiated pressure, is denoted by $P_3^-$. The three-port structure for the tone hole simulator is essentially that of FIG. 14 without the waveguide 53-3 and without any control variable 51 input as indicated by junction 52 in FIG. 14. The junction 52 is placed as one of the junctions, such as junction 26-i in FIG. 4. With such a configuration, the junctions pressure, $P_J$, is given as follows:

$$P_J = \sum_{i=1}^{3} \alpha_i P_i^+$$

where, $\alpha_i=2\Gamma_i/(\Gamma_1+\Gamma_2+\Gamma_3)$, $\Gamma_i$=characteristic admittance in $i^{th}$ waveguide $P_i^- = P_j - P_i^+$ $P_J=\alpha_1P_1^+ +\alpha_2P_2^+ =\alpha_1P_1^+ +(2-\alpha_1-\alpha_3)P_2^+$ $P_1^- =P_J-P_1^+ =(\alpha_1-1)P_1^+ +\alpha_2P_2^+$ $P_2^- =P_J-P_2^+ =\alpha_1P_1^+ +(\alpha_2-1)P_2^+$ $P_3^- =P_J-P_3^+ =P_J$ (tone hole output)

$$\text{Let, } \Gamma_3 = \begin{cases} (\Gamma_1+\Gamma_2)/2, & \text{open hole} \\ 0, & \text{closed hole} \end{cases}$$

Then, $$\alpha_3 = \begin{cases} 1, & \text{open hole} \\ 0, & \text{closed hole} \end{cases}$$

$$\alpha_2 = \begin{cases} 1-\alpha_1, & \text{open hole} \\ 2-\alpha_1, & \text{closed hole} \end{cases}$$

Then, with $P_\Delta^+ = P_1^+ - P_2^+$, we obtain the one multiply tone-hole simulation:

$$P_2^- = \alpha_1 P_\Delta^+,\ P_1^- = P_2^- - P_\Delta^+,\ \text{(open hole)}$$

In a smooth bore, $\Gamma 1=\Gamma_2=\Gamma$ and $\Gamma_3=\beta\Gamma$, where $\beta$ is the cross-sectional area of the tone hole divided by the cross-sectional area of the bore. For a clarinet, $\beta=0.102$ and for a saxophone, $\beta=0.436$, typically. So we have:

$$\Gamma_3 \underset{=}{\Delta} \beta\Gamma = \begin{cases} \beta\Gamma, & \text{open} \\ 0, & \text{closed} \end{cases}$$

Then, $$\alpha_1=\alpha_2=2\Gamma/(2\Gamma+\beta\Gamma) \underset{=}{\Delta} \alpha$$

$$\alpha_3=2\beta/(2+\beta)=\beta\alpha,$$

There is now a single parameter $$\alpha = \begin{cases} 2/(2+\beta), & \text{open} \\ 1, & \text{closed} \end{cases}$$

So, the tone hole simulation is given by $$P_J=\alpha(P_1^+ +P_2^+) \text{ (if open)}$$

$$P_1^- =P_J-P_2^+ =\alpha P_2^+ +(\alpha-1)P_1^+ =P_2^+ \text{(if closed)}$$

$P_2^- = P_J - P_1^+ = \alpha P_1^+ + (\alpha - 1)P_2^+ = P_1^+$ (if closed)

Summary:

$$\alpha = \left| \begin{array}{l} 0.95, \text{ clarinet} \\ 0.821, \text{ saxophone} \end{array} \right.$$

$$\Gamma_3 = \beta\Gamma$$

$$P_J = \alpha P_1^+ + P_2^+)$$

$$P_1^- = P_J - P_1^+$$

$$P_2^- = P_J - P_2^+$$

$$\alpha = \left| \begin{array}{l} 2/(2 + \beta), \text{ open} \\ 1, \text{ closed} \end{array} \right.$$

a = bore radius
b = hole radius $$\beta = b^2/a^2 = \left| \begin{array}{l} 0.102, \text{ clarinet} \\ 0.436, \text{ saxophone} \end{array} \right.$$

$\alpha = (2a^2)/(2a^2 + b^2)$ - hole open
$\alpha = 1$ - hole closed
$P_J$ is radiated away spherically from the open hole with a (1/R) amplitude attenuation.

Reed Simulation

Figure 23:
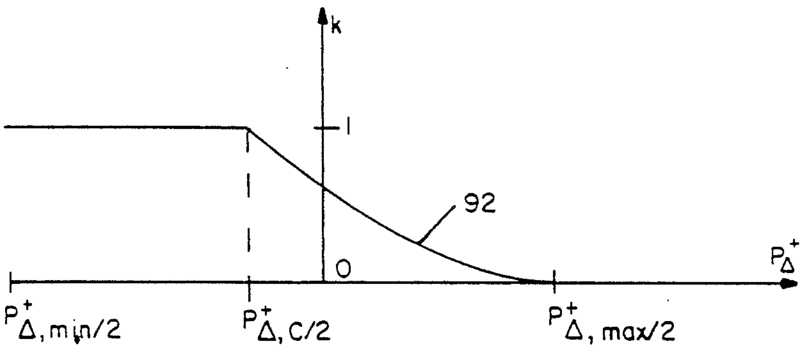
FIG. 23 is a graph of a waveform representing the data stored in the table of FIG. 16 for a reed instrument.

In FIG. 23, a graph is shown representing the data that is typically stored in the table 59 of FIG. 16 for a reed instrument. The output signal $R^-(n)$ on line 54 is as follows:

$$R^-(n) = k * P_\Delta^+/2 + P_m(n)/2$$

The control variable input on line 56 is $P_m(n)/2$ and the input on line 68 to the table 59 is $$(P_\Delta^+)/2 = (R^+(n) - P_m(n)/2)$$

where $R^+(n)$ is the signal sample on line 55 of FIG. 16.

The table 59 is loaded with values which, when graphed, appear as in FIG. 23. The curve 92 in FIG. 23 has a maximum value of one and then trails off to a minimum value of zero. The maximum value of one occurs between $(P_{\Delta,min}^+)/2$ and $(P_{\Delta,c}^+)/2$. The value $(P_{\Delta,c}^+)/2$ corresponds to the closure of the reed. From $(P_{\Delta,c}^+)/2$ to $(P_{\Delta,max}^+)/2$ the curve 92 decays gradually to zero. The equation for the curve 92 is given as follows, $$\text{Curve} = [(P_{\Delta,max}^+ - P_\Delta^+)/(P_{\Delta,max}^+ - P_{\Delta,c}^+)]^l$$

where $l = 1, 2, 3, \ldots$

The output from the table 59 is the variable k as given in FIG. 23, that is, $$k = k[(P_\Delta^+)/2]$$

Bowed-String Simulation

Figure 18:
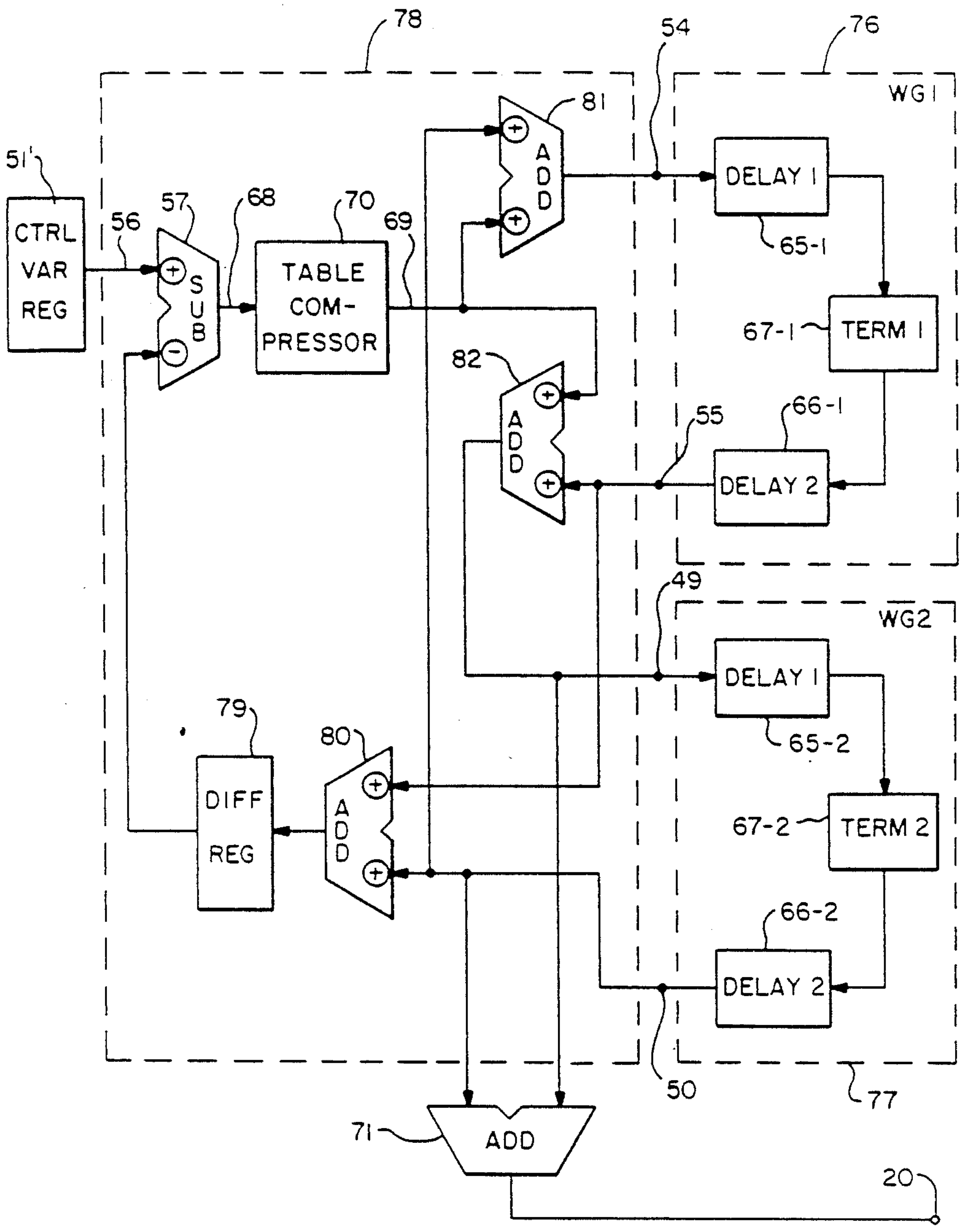
FIG. 18 depicts a non-linear junction connected to first and second waveguides.
Figure 24:
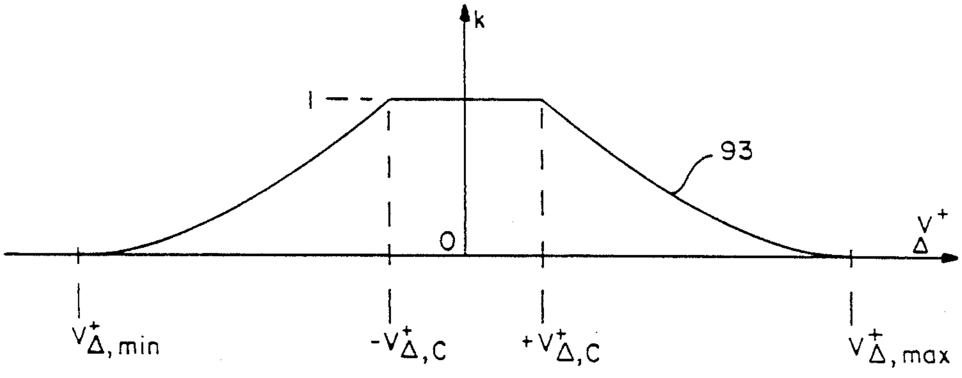
FIG. 24 is a graph of a waveform representing the data stored in the table of FIG. 16 for a string instrument.

In FIG. 24, a graph is shown representing the data that is typically stored in the coefficient table 59 of the signal table 70 (see FIG. 16) of FIG. 18. The output signals $V_{s,l}^-$ on line 54 and $V_{s,r}^-$ on line 49 are as follows:

$$V_{s,l}^- = k(V_\Delta^-) * V_\Delta^+ + V_{s,r}^+$$

$$V_{s,r}^- = k(V_\Delta^+) * V_\Delta^+ + V_{s,l}^+$$

The control variable input on line 56 is bow velocity, $V_b$, and the input on line 68 to the table 59 is $$V_\Delta^+ = V_b - (V_{s,l}^+ + V_{s,r}^+)$$

where $V_{s,l}^+$ is the signal sample on line 55 and $V_{s,r}^+$ is signal sample on line 50 of FIG. 18.

The table 59 is loaded with values which, when graphed, appear as in FIG. 24. The curve 93 in FIG. 24 has a maximum value of one and then trails off to a minimum value of zero to the left and right symmetrically. The maximum value of one occurs between $-V_{\Delta,c}^+$ and $+V_{\Delta,c}^+$. From $(V_{\Delta,c}^+)$ to $(V_{\Delta,max}^+)$ the curve 93 decays gradually to zero. The equation curve 93 is given as follows, $$\text{Curve} = [(V_{\Delta,max}^+ - V_\Delta^+)/(V_{\Delta,max}^+ - V_{\Delta,c}^+)]^l$$

where $l = 1, 2, 3, \ldots$

The output from the table 59 is the reflection coefficient k as given in FIG. 24, that is, $$k = k[(V_\Delta^+)]$$

Compressed Table Variations

The compressed table 59 of FIG. 16 containing $g(x) = f(x)/x$ is preferable in that quantization errors are relative. However, alternatives are possible. The entire table compressor 70 of FIG. 16 can be replaced with a simple table. In such an embodiment, the round off error is linear and not relative. For linear errors, the error-to-signal ratio tends not to be constant. Therefore, for small signal amplitudes, the error tends to be significant so that the error may interfere with the intended operation. In either the table compressor embodiment 70 of FIG. 16 or a simple table previously described, the tables can employ compression techniques such as linear, Lagrange and quadratic interpolation with satisfactory results. In a linear interpolation example, the curve 92 of FIG. 23 would be replaced by a series of straight line segments thereby reducing the amount of data required to be maintained in the table.

Figure 22:
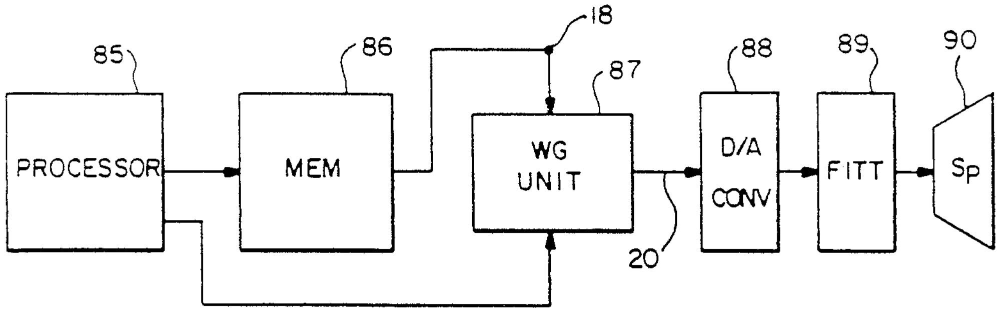
FIG. 22 is a signal processor forming a music instrument using digital waveguides.

Also table 59, address register 58 and data register 61 of FIG. 16 each have inputs 94, 95 and 96 from processor 85 (FIG. 22).

The inputs from processor 85 function to control the data or the access of data from the table 59. Modifications to the data in the table can be employed, for example, for embouchure control for reed synthesis. Similarly, articulation control for bowed-string synthesis is possible. In one example, the address register 58 has high order address bits, bits 10 and 11, which are supplied by lines 95 from the processor. In this manner, the high order bits can be used to switch effectively to different subtables within the table 59. This switching among subtables is one form of table modification which can be used to achieve the embouchure and articulation modifications.

Non-Linear Junction with Plural Waveguides—FIG. 18

In FIG. 18, further details of another embodiment of a non-linear junction is shown connected between a first waveguide 76 and a second waveguide 77. The non-linear junction 78 receives an input from the control variable register 51' and provides inputs to the waveguide 76 on lines 54 and receives an output on lines 55. Also the non-linear junction 78 provides an output to the waveguide 77 on lines 49 and receives an input on lines 50.

In FIG. 18, the non-linear junction 78 includes an adder 57 receiving as one input the control variable from the control variable register 51' on lines 56. The other input to the subtractor 57 is from the difference register 79 which in turn receives an output from an adder 80. The adder 80 adds the inputs on lines 55 from the waveguide 76 and lines 50 from the waveguide 77.

The output from the subtractor 57 on lines 68 is input to the table compressor 70. The table compressor 70 of FIG. 12 is like the table compressor 70 of FIG. 10 and provides an output on lines 69. The output on lines 69 connects as one input to each of the adders 81 and 82. The adder 81 receives as the other input the input from lines 50 from the waveguide 77 to form the input on lines 54 to the first waveguide 76. The second adder 82 receives the table compressor signal on lines 69 and adds it to the input from the first waveguide 76 on lines 55. The output from adder 82 connects on lines 49 as the input to the second waveguide 77.

In FIG. 18, the waveguide 76 includes the top rail delay 65-1 and the bottom rail delay 66-1 and a terminator 67-1.

Similarly, the second waveguide 77 includes a top rail delay 65-2 and a bottom rail delay 66-2 and a terminator 67-2.

In the case of a violin in which the long string portion is approximately one foot and the short string portion is one-fifth of a foot, the waveguides of FIG. 18 are as follows. The terminator 67-1 is merely an inverter which changes the sign of the first rail value from delay 65-1 going into the delay 66-1. For example, the changing the sign is a 2's complement operation in digital arithmetic. Each of the delays 65-1 and 66-1 is the equivalent of about fifty samples in length for samples at a 50 KHz frequency. The terminator 67-2 in the waveguide 77 is typically ten samples of delay at the 50 KHz sampling rate. The terminator 67-2 can be a single pole low-pass filter. Alternatively, the terminator can be a filter having the empirically measured bridge reflectance cascaded with all sources of attenuation and dispersions for one round trip on the string. Various details of a violin appear in APPENDIX C.

Figure 19:
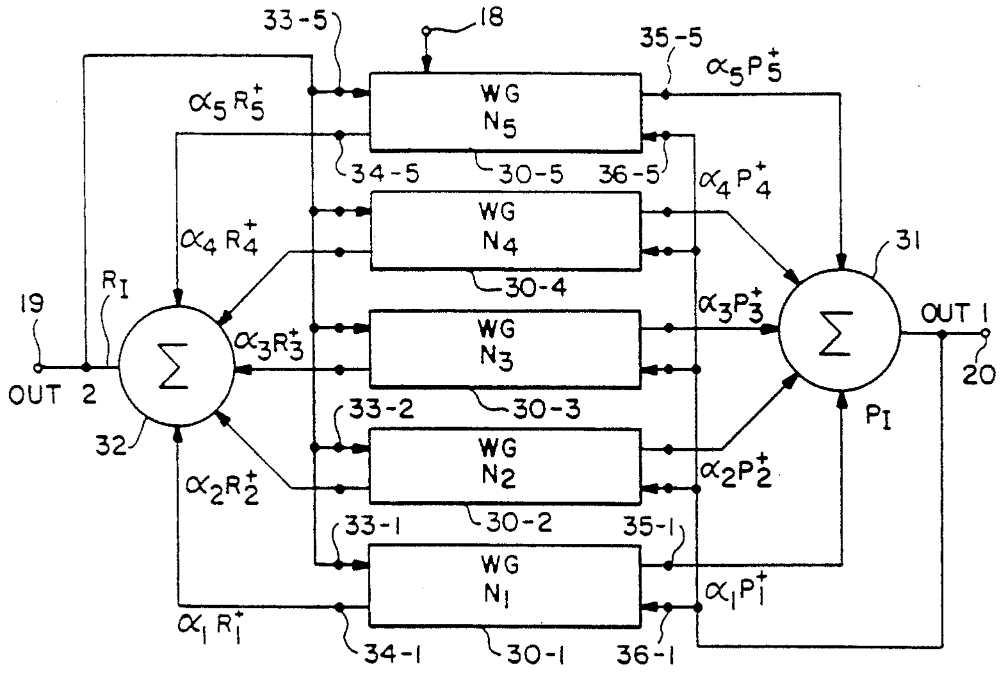
FIG. 19 depicts a waveguide reverberator.

Reverberator—FIG. 19

One lossless reverberator is augmented as shown in FIG. 19 by one or more simple loss factors (typically of the form $1-2^{-n}$) in waveguides 30 to set the reverberation decay times to any desired values. The time, $T_{60}$, over which the reverberation decays 60 dB is arbitrary. This decoupling of reverberation time from structure incurs no loss of generality in the present invention.

Some of the waveguides 30 of the network are determined to give specific early reflections, while others are chosen to provide a desirable texture in the late reverberation. An optimality criterion for the late reverberation is to maximize homogeneity of the impulse response by making it look like exponentially decaying white noise.

The waveguide networks of the present invention allow every signal path to appear as a feedback branch around every other signal path. This connectivity richness facilitates development of dense late reverberation. Furthermore, the energy conserving properties of the waveguide networks can be maintained in the time-varying case which allows the breaking up of unwanted patterns in the late reverberation by subtly changing the reverberator in a way that does not modulate the reverberation decay profile. Finally, the explicit conservation of signal energy provides an easy way to completely suppress limit cycles and overflow oscillations.

In FIG. 19, one typical waveguide reverberator is shown including five waveguides (branches) formed by the waveguides 30-1, 30-2, . . . , 30-5. The waveguides 30 are connected to junctions 31 and 32. The waveguides 30-1 through 30-5 have first rail inputs 33-1 through 33-5, respectively, have first rail outputs 35-1 through 35-5, respectively, have second rail inputs 36-1 through 36-5, respectively, and have second rail outputs 34-1 through 34-5, respectively. The first rail outputs 35-i, where i has values from 1 to 5, includes the output signals $\alpha_i P_i^+$, for i=1 through 5. The outputs 35-i each connect to the summing node 31. Summing node 31 is an adder which adds all of the $\alpha_i P_i^+$ signals to form the junction pressure signal $P_J$. The $P_J$ signal connects in common to each of the second rail inputs 36-1 through 36-5. The $P_J$ signal at terminal 20 is typically used to provide an output from the reverberator of FIG. 19. In FIG. 19, the input 18 is typically connected to at least one of the waveguides 30 such as waveguide 30-5.

In FIG. 19, the waveguides 30-1 through 30-5 provide the second rail outputs 34-i for i=1 to 5. The outputs 34-i provide the signals $\alpha_i R_i^+$ which in turn connect as inputs to the summing node 32. The summing node 32 sums all of the signals $\alpha_i R_i^+$ to form the node signal $R_J$ at terminal 19. A second output is typically taken from terminal 19. Additionally, the $R_J$ signal from summing node 32 connects in common to all of the first rail inputs 33-1 through 33-5.

Figure 20:
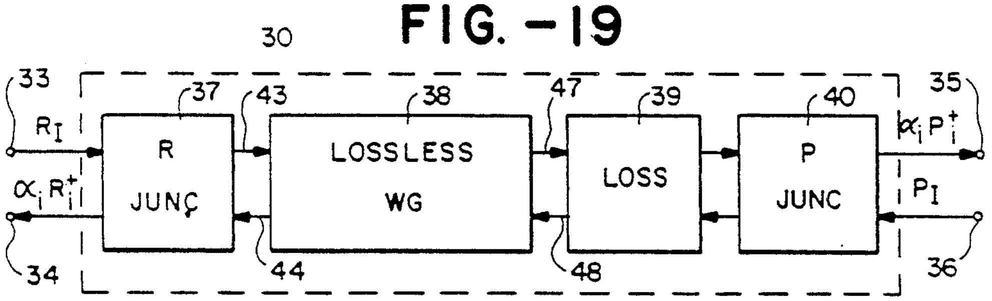
FIG. 20 depicts a typical waveguide employed in the FIG. 19 reverberator.
Figure 21:
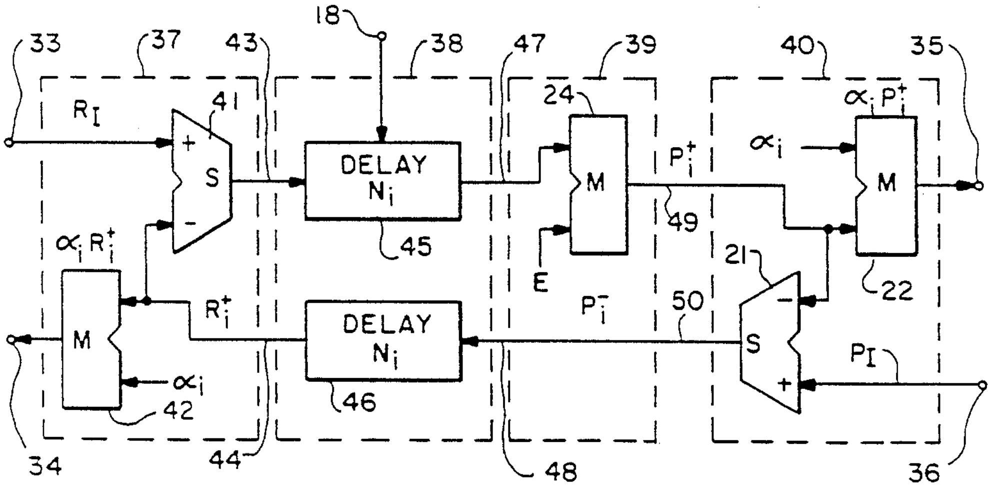
FIG. 21 depicts details of the FIG. 20 waveguide.

Reverberator Waveguide—FIGS. 20 and 21

In FIG. 20, further details of the waveguides 30 of FIG. 19 are shown. Typically, each of the waveguides 30 in FIG. 19 includes an R junction 37, a lossless waveguide 38, a loss unit 39 and a P junction 40.

In FIG. 21, further details of the typical waveguide of FIG. 20 are shown. The R junction 37 includes a subtractor 41 and a multiplier 42. The subtractor 41 subtracts $R_i^+$ from the $R_J$ signal to provide the $R_i^-$ signal on line 43. The multiplier 42 multiplies the $R_i^+$ times a gain factor, $\alpha_i$, to provide the signal $\alpha_i R_i^+$ signal at output terminal 34-i.

The lossless waveguide 38 includes a lossless delay 45 and a lossless delay 46. The delay 45 delays by a delay, N. With the signal input to the delay on line 43 equal to $R_i^-(t)$, the delayed output signal on line 47 is equal to $R_i^-(t-N)$. Similarly the delay 46 delays the input signal $P_i^-(t)$ by N to form the delayed signal on line 44 equal by definition to $P_i^-(t-N)$, which is equal to the $R_i^+(t)$ signal.

In FIG. 21, the loss unit 39, in one particular embodiment, includes a multiplier 24. Multiplier 24 multiplies the signal on line 47 by $\epsilon$ to provide on the output the $P_i^+(t)$ signal equal to $\epsilon R_i^-(t-N)$. While the loss circuit in the form of multiplier 24 has been inserted in the line 47, the loss circuit may alternatively be placed also in any one or more of the lines 43, 44, 47 or 48.

In FIG. 21, the P junction 40 typically includes a subtractor 21 and a multiplier 22. The subtractor 21 receives the $P_i^+$ signal and subtracts it from the junction pressure signal $P_J$ to produce the $P_i^-$ signal. Multiplier 22 multiplies the $P_i^+$ signal by $\alpha_i$ to form the $\alpha_i P_i^+$ signal.

In summary, the reverberator of FIGS. 19–21 consists of waveguides 30-1 through 30-5 connected together to form an arbitrary network. The waveguides 30-1 through 30-5 can be referred to as "branches" and their points of intersection 31 and 32 as "junctions" or "nodes".

Reflections are created by a mismatch between the admittances $\Gamma_i$ of the intersecting waveguides. The admittance is the inverse of the characteristic impedance $Z_i$. Setting the waveguide admittances all equal is acceptable as long as the waveguide delays $N_i$ are different. Equal characteristic admittances means that when a signal comes into a junction of waveguides, it will be split equally into all outgoing waveguides. In the reverberator of FIG. 19, equal characteristic admittances result in $\alpha_i = 2/5$ for all i. Choosing a power of Z for the number of branches means $\alpha_i$ is a power of Z and can therefore be implemented in binary arithmetic by means of a shift operation.

If a waveguide with small admittance connects to a waveguide of much higher admittance, the pressure wave will be partially reflected with a sign reversal In the limit:

- a pressure wave is completely reflected with a sign reversal when it encounters an admittance which is infinitely larger than the one in which it was traveling;
- a pressure wave is completely reflected with no sign reversal when it encounters an admittance which is infinitely smaller than the one in which it was traveling;
- a pressure wave is not reflected at all (complete transmission) when it encounters an admittance which is the same as the one in which it was traveling in, the "matched-impedance" case.

Time-Varying Reverberation

The effect of amplitude modulation of a waveguide admittance is to vary the admittance away from its original value. In order for the network to remain lossless, the sum of incoming scattering coefficients [$\alpha_i$ of Eq. (2)] must equal 2. Let $\Gamma_i(t)$ denote the time-varying branch admittances. Then from Eq. (2)

$$\alpha_i(t) = (2\Gamma_i(t)) / \left(\sum_{i=1}^{N} \Gamma_1(t)\right)$$

$$\text{and } \sum_{i=1}^{N} \alpha_i(t) = 2 \text{ at all times.}$$

The objective is to vary $\alpha_i(t)$ in a complex waveguide network such that $$\sum_{i=1}^{N} \alpha_i(t) = 2 \text{ and } \alpha_i(t) = 2\Gamma_i(t) / \sum_{i=1}^{N} \Gamma_i(t)$$

for some waveguide admittance values $\Gamma_i(t)$.

The easiest case is the two-junction network such as shown in FIG. 19. In this case, the $\alpha_i(t)$ are identical at the two junctions.

One time-varying reverberation technique in the two-junction case is to vary the $\Gamma_i$ such that $$\sum_{i=1}^{N} \Gamma_i = c \text{ for some constant } c.$$

Then $$\alpha_i(t) = 2\Gamma_i(t)/c. \text{ and } \sum_{i=1}^{N} \alpha_i(t) = 2 \text{ as } c.$$

Then $$\alpha_i(t) = 2\Gamma_i(t)/c. \text{ and } \sum_{i=1}^{N} \alpha_i(t) = 2$$

as required for losslessness of the network. A special case is where $\Gamma_i + \Gamma_j = c_i$ in pairs. Another method for the time varying case is, at each junction, to provide one "reflection-free port" (RFP). Such a port is created when the admittance of one waveguide (that connected to the RFP) is equal to the sum of the admittances of all other waveguides meeting at that junction. In this implementation, the waveguide of the RFP has admittance 1, and it does not vary with time. We call this a "special" waveguide. Since every waveguide must connect to exactly two junctions, a special waveguide provides a RFP at two different junctions simultaneously. (A special waveguide is not very useful as a self-loop at some junction due to the next constraint.)

Given a reflection-free port caused by a special waveguide of admittance 1, the sum of the remaining waveguide admittances is 1. Since the waveguide connected to the reflection-free port is time-invariant, the sum of all time-varying admittances will be 1.

A simple method for time-varying reverberation using a RFP is to pair off the time-varying waveguides so that their admittances sum to 1 in pairs. This pairing is handy because a pair is the smallest number of mutually constrained waveguides that can be arranged When there are more than two nodes (junctions), simple complementary pairing of time-varying junctions may be difficult.

Musical Instrument—FIG. 22

In FIG. 22, a typical musical instrument, that is signal processor, employing the waveguide units of the present invention is shown. In FIG. 22, a processor 85, such as a special purpose or general purpose computer, generates a digital signal representing the sound to be produced or a control variable for a synthesizer. Typically, the processor 85 provides an address for a random access memory such as memory 86. Memory 86 is addressed and periodically provides a digital output representing the sound or control variable to be generated. The digital sample from the memory 86, typically at a sampling rate $T_s$ (usually near 50 KHz), is connected to the waveguide unit 87. Waveguide unit 87 processes the digital signal in accordance with the present invention and provides an output to the digital-to-analog (D/A) converter 88. The converter 88 in turn provides an analog output signal through a filter 89 which connects to a speaker 90 and produces the desired sound.

When the signal processor of FIG. 22 is a reed instrument, the structure of FIGS. 15, 16 and 17 is typically employed for waveguide unit 87. In FIG. 15, the control variable 51 is derived from the processor 85 and the memory 86 of FIG. 22. The structure of FIGS. 15, 16 and 17 for a clarinet uses the FIG. 17 structure for waveguide 53 with a simple inverter (−1) for terminator 67. For a saxophone, the waveguide 53 is more complex, like FIG. 4.

When the signal processor of FIG. 22 is a bowed-string instrument, the waveguide unit 87 in FIG. 22 typically employs the structure of FIG. 18. The control variable input to register 51' of FIG. 18 comes from the memory 86 of FIG. 22. The output from the waveguide unit of FIG. 18 is derived from a number of different points, for example, from the terminals 54 and 55 for the waveguide 76 or from the terminals 49 and 50 from the waveguide 77 of FIG. 18. In one typical output operation, an adder 71 adds the signals appearing at terminals 49 and 50 to provide an input at terminal 20 to the D/A converter 88 of FIG. 22. The sum of the signals in adder 71 corresponds to the string velocity at the location of the bow on the instrument.

When reed and other instruments are employed, it has been found useful to introduce white noise summed with the control variable input to register 51' of FIG. 16. Additionally, the introduction of tremolo and other musical effects into the control variable enhances the quality of the sound produced.

When the waveguide unit 87 of FIG. 22 is a digital reverberator, the waveguide of FIG. 19 is typical with the parameters of TABLE 1.

TABLE 1

| |
|---|
| $N_1T_s = 5$ ms. |
| $N_2T_s = 17$ ms. |
| $N_3T_s = 23$ ms. |
| $N_4T_s = 67$ ms. |
| $N_5T_s = 113$ ms. |
| $T_s \simeq 20$ microseconds |
| $\epsilon = 0.9$ where $\lvert\epsilon\rvert \leqq 1$ |
| $\sum_{i=1}^{5} \alpha_i = 2$ (lossless condition) where $0 \leqq \alpha_i \leqq 2$ |
| For time-varying reverberation: |
| $\alpha_1 = 1$ |
| $\alpha_2 = \beta_1/2$ |
| $\alpha_3 = (1 - \beta_1)/2 \quad 0 \leqq \beta_1 \leqq 1$ |
| $\alpha_4 = \beta_2/2 \quad 0 \leqq \beta_2 \leqq 1$ |
| $\alpha_5 = (1 - \beta_2)/2$ |

What is claimed is:

1. A digital reverberation system comprising:

a branched network including a plurality of branches formed of digital waveguides and a plurality of junctions interconnecting the waveguides, wherein:

each waveguide includes two digital delay lines running parallel to each other for propagating signals in opposite directions and having a first end and a second end, said first end having an input to a first delay line and an output from a second delay line and said second end having an input to the second delay line and an output from the first delay line, each waveguide having at least one of its ends connected to a junction;

at least one of the junctions has at least three waveguide ends connected to it and signals arriving at each junction from a particular waveguide end are partially transmitted to every other waveguide end connected to the junction and partially reflected back to said particular waveguide end;

means for introducing losses into signals propagating in the network;

input means for providing an audio input signal to be reverberated to the network; and output means for providing at least one reverberation output signal from the network.

2. A digital reverberation system as in claim 1 wherein the input means comprises a digital waveguide having one end thereof connected to a junction, wherein the input signal is introduced at the other end of said waveguide.

3. A digital reverberation system as in claim 1 wherein the output means comprises a digital waveguide having one end thereof connected to a junction of the network, wherein an output signal is obtained at the other end thereof.

4. A digital reverberation system as in claim 1 wherein each junction is comprised of at least one of a multiplier and adder.

5. A digital reverberation system as in claim 4 wherein each junction includes at least one multiplier and wherein multiplication coefficients of said multipliers vary with time, thereby achieving time varying reverberation characteristics.

6. A digital reverberation system as in claim 1 wherein the means for introducing losses is configured to provide a desired reverberation time.

7. A digital reverberation as in claim 6 wherein said means for introducing losses introduces a loss of $1-2^{-n}$ to at least one signal propagating in the network.

8. A digital reverberation system as in claim 1 wherein at least one junction has time varying characteristics to vary at least one of the relative transmission and reflection to the waveguide ends connected to the junction as a function of time.

9. A digital reverberation system as in claim 1 wherein each junction is comprised of multipliers and adders configured to interconnect the output of each waveguide end connected to the junction with the input of each waveguide end connected to the junction so as to multiply the signal from each waveguide end by a particular coefficient and sum it with multiplied signals from every other waveguide end thereby to provide a desired signal to the input of each waveguide end connected to the junction.

10. A digital reverberation system as in claim 1 wherein at least one junction is configured so that a signal from any waveguide end is passed in equal proportion to the inputs of all waveguide ends connected to the junction.

11. A digital reverberation system as in claim 1 including first and second junctions and at least three parallel waveguides each having a predetermined delay amount, each having a first end connected to the first junction and a second end connected to the second junction.

12. A digital reverberation system as in claim 1 wherein the delay lines in any particular waveguide provide delays which are substantially equal to one another.

13. The digital reverberation system of claim 1 wherein:

at least one waveguide is comprised of:

a first delay element in the first delay line;

a second delay element in the second delay line;

means for introducing a loss in signals propagating in at least one of the delay lines;

first adder means for adding the signal at the first end input to a signal on the second delay line following the output of the second delay element to provide a signal to the first delay element;

second adder means for adding the signal at the second end input to a signal on the first delay line following the first delay element to provide a signal to the second delay element;

first delay line multiplier means for multiplying a signal $P_i+$ on the first delay line following the first delay element by a factor $\alpha_i R_i+$; and wherein a first junction receives signals from delay lines connected to it and forms a sum $P_I$ as follows:

$$P_I = \sum_{i=1}^{I} \alpha_i P_i+$$

and provides the signal $P_I$ to each waveguide input connected to the junction, and wherein a second junction receives signals from delay lines connected to it and forms a sum $R_I$ as follows:

$$R_I = \sum_{i=1}^{I} \alpha_i R_i+$$

and provides the signal $R_I$ to each waveguide input connected to the junction.

14. The digital reverberation system of claim 1 wherein said network includes a plurality, i, where $i>2$ of waveguides connected in parallel between first and second junctions such that the first end of each waveguide is connected to the first junction and the second end of each waveguide is connected to the second junction, said waveguides forming first end output signals, $P_i+$, and waveguides forming first end output signals, $P_i+$, and second end output signals, $R_i+$, said first junction including means for summing the first end output signals, $P_i+$, to form a first end summed signal, $P_I$, and including means for connecting said first end summed signal as an output to said first end of each of said waveguides, and wherein said second junction includes means for summing said second end output signals, $R_i+$, to form a summed second end output signal, $R_I$, and including means for connecting said second end summed signal as an input to said second end of each of said waveguides.

15. The digital reverberation system of claim 1 wherein each waveguide has a characteristic impedance and where the sum of all of the characteristic impedances for the waveguides connected to a junction sums to a constant.

16. A reverberation system comprising:

a branched network including a plurality of branches formed of waveguides and a plurality of junctions interconnecting the waveguides, wherein:

each waveguide includes two signal paths running parallel to each other for propagating signals in opposite directions wherein at least one of the paths includes a delay, each waveguide having a first end and a second end, said first end having an input to a first path and an output from a second path and said second end having an input to the second path and an output from the first path, each waveguide having at least one of its ends connected to a junction;

at least one of the junctions has at least three waveguide ends connected to it and signals arriving at each junction from a particular waveguide end are transmitted by a predetermined amount which may include zero to other waveguide ends connected to the junction and reflected back by a predetermined amount which may include zero to said particular waveguide end;

means for introducing losses in o signals propagating in the network;

input means for providing an audio signal to be reverberated to the network; and output means for providing a least one reverberation output signal from the network.

* * * * *

UNITED STATES PATENT AND TRADEMARK OFFICE
CERTIFICATE OF CORRECTION

PATENT NO. : 4,984,276

DATED : January 8, 1991

INVENTOR(S) : Julius O. Smith

It is certified that error appears in the above-identified patent and that said Letters Patent is hereby corrected as shown below:

On the title page, under the heading "References Cited," the following additional U.S. Patent and other Publications should be listed:

4,475,229 10/1984 Frese 381/63

James A. Moorer, "About This Reverberation Business," Computer Music Journal, Vol. 3, Nov. 2, 1979.

Julius O. Smith, "A New Approach To Digital Reverberation Using Waveguide Networks," Center For Computer Research In Music And Acoustics, Dept. of Music, Stanford University, August 19, 1985.

Signed and Sealed this

Fifth Day of January, 1993

*Attest:*

DOUGLAS B. COMER

*Attesting Officer* *Acting Commissioner of Patents and Trademarks*

UNITED STATES PATENT AND TRADEMARK OFFICE

CERTIFICATE OF CORRECTION

PATENT NO. : 4,984,276

DATED : January 8, 1991

INVENTOR(S) : Julius O. Smith

It is certified that error appears in the above-identified patent and that said Letters Patent is hereby corrected as shown below:

In claim 16, at column 26, line 37, change "in o" to --into--.

Signed and Sealed this

Ninth Day of March, 1993

*Attest:*

STEPHEN G. KUNIN

*Attesting Officer*

*Acting Commissioner of Patents and Trademarks*